(12) United States Patent
Muchherla et al.

(10) Patent No.: US 12,105,967 B2
(45) Date of Patent: Oct. 1, 2024

(54) TWO-TIER DEFECT SCAN MANAGEMENT

(71) Applicant: Micron Technology, Inc., Boise, ID (US)

(72) Inventors: Kishore Kumar Muchherla, Fremont, CA (US); Robert Loren O. Ursua, Folsom, CA (US); Sead Zildzic, Rancho Cordova, CA (US); Eric N. Lee, San Jose, CA (US); Jonathan S. Parry, Boise, ID (US); Lakshmi Kalpana K. Vakati, Fremont, CA (US); Jeffrey S. McNeil, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 17/894,794

(22) Filed: Aug. 24, 2022

(65) Prior Publication Data
US 2024/0069765 A1 Feb. 29, 2024

(51) Int. Cl.
*G06F 3/06* (2006.01)
(52) U.S. Cl.
CPC .......... *G06F 3/0629* (2013.01); *G06F 3/0625* (2013.01); *G06F 3/0679* (2013.01)
(58) Field of Classification Search
CPC ..... G06F 3/0629; G06F 3/0625; G06F 3/0679
See application file for complete search history.

(56) References Cited

U.S. PATENT DOCUMENTS

| | | | |
|---|---|---|---|
| 2016/0163382 A1* | 6/2016 | Conley | G11C 16/3459 365/185.03 |
| 2017/0070241 A1* | 3/2017 | Kaku | H03M 13/2906 |
| 2017/0249211 A1* | 8/2017 | Hoei | G11C 29/74 |
| 2017/0345510 A1* | 11/2017 | Achtenberg | G11C 16/3413 |
| 2021/0027846 A1* | 1/2021 | Malshe | G11C 29/021 |

* cited by examiner

*Primary Examiner* — Michael Krofcheck
(74) *Attorney, Agent, or Firm* — Lowenstein Sandler LLP

(57) ABSTRACT

A system can include a processing device operatively coupled with the one or more memory devices, to perform operations that include writing data to the one or more memory devices and performing one or more scan operations on a management unit containing the data to determine a current value of a chosen data state metric. Each scan operation can be performed using a corresponding predetermined read-time parameter value. The operations can include determining whether the current value of the chosen data state metric satisfies a criterion, and can also include, responsive to determining that the current value of the chosen data state metric satisfies the criterion, selecting a remedial operation by determining whether redundancy metadata is included in a fault tolerant data stripe on the one or more memory devices. The operations can also include performing the remedial operation with respect to the management unit.

20 Claims, 8 Drawing Sheets

TWO-TIER DEFECT SCAN MANAGEMENT

TECHNICAL FIELD

Embodiments of the disclosure relate generally to memory sub-systems, and more specifically, relate to managing defect scans on memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
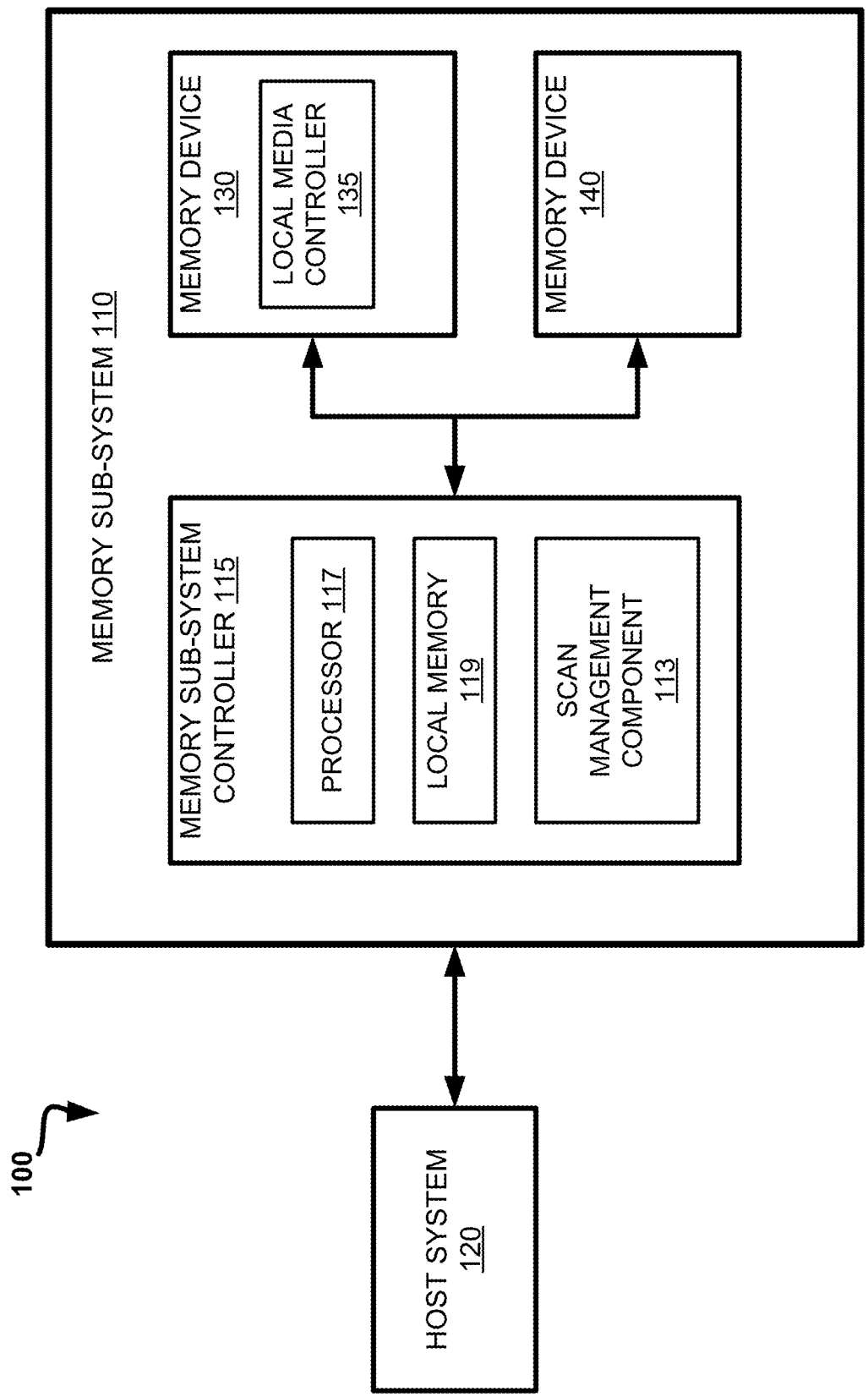
FIG. 1 illustrates an example computing system that includes a memory sub-system in accordance with some embodiments of the present disclosure.

Aspects of the present disclosure are directed to tiered defect scan management in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane can consist of a set of physical blocks. Each block can consist of a set of pages. Each page can consist of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of cells arranged in a two-dimensional grid. Memory cells are etched onto a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., a row) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Memory devices can be manufactured with certain imperfections and can develop defects in their components over time. In some cases, a memory device management unit (e.g., a block) can be defined to contain a defect when the memory device cannot reliably read data from the component. For example, a block of a memory device can be said to be defective if the memory device cannot reliably read data from the block or when attempts to read data from the block result in a rate or a number of errors that exceeds the capability of the device to compensate for them. To monitor memory devices and check for defects, defectivity scans can be performed on management units (e.g., that can span across one or more dies, planes, blocks, pages, cells, etc.) of a memory device. Such scans can include measurements of various data state metrics such as the raw bit error rate (RBER), which refers to the error rate in terms of a count of bits when a data access operation is performed on a memory device.

In some memory sub-systems, in order to mitigate potential defects in data-storing components of memory devices, data can be written in accordance with fault tolerant redundancy schemes, such as a redundant array of independent NAND (RAIN) scheme, which can be implemented for error checking and correction. One type of such a fault tolerant redundancy scheme can store system data in groups of pages, each such group of pages referred to herein as a "fault tolerant stripe", such that each stripe includes a redundancy metadata page (e.g., a parity page with RAIN parity metadata). Thus, in some embodiments, the fault tolerant data stripe can include a redundant array of independent NAND (RAIN) memory pages. In these types of RAIN schemes, the memory sub-system can store different portions of the system data on different pages in the fault tolerant stripe and can use the redundancy metadata page to reconstruct the system data if one of the pages in the stripe becomes defective or fails. This type of RAIN schemes can have redundancy metadata permanently stored together with the system data in the same location or can have the redundancy metadata stored in a different location than the host data. When a RAIN scheme uses permanently stored redundancy metadata, it can be referred to as a "permanent parity" scheme and when a RAIN scheme uses temporarily stored redundancy metadata, it can be referred to as a "temporary parity" scheme.

Alternatively, RAIN can be implemented without using redundancy metadata by duplicating specific portions of system data and storing redundant copies of those portions of system data on multiple pages in the fault tolerant stripe. This RAIN scheme enables the memory sub-system to have one or more redundant copies of the portion of the data available even if one of the pages in the stripe becomes defective or fails. When a RAIN scheme does not include a page with parity metadata in the fault tolerant stripe, it can be referred to as a "parity-less" scheme. These types of RAIN schemes can often be implemented with a specified maximum number of defective/failed pages that the RAIN stripe is permitted to contain. That maximum number can be defined by a host system requirement that a corresponding minimum number of redundant copies of each data portion that is to be reliably accessible at all times on the memory device. Accordingly in some memory sub-systems, whenever the number of defective pages in a given RAIN stripe exceeds the maximum number, the host system's fault tolerance requirements can be violated and can require remedial operations to be performed to bring the fault tolerance state of the sub-system into compliance with the host system's requirements.

Thus, recurring defectivity scans can be performed on memory sub-systems that implement some of the aforementioned RAIN schemes to maintain data integrity. In some cases, the defectivity scans can be used to determine whether temporary RAIN parity metadata needs to be retained to remedy detected defects or whether it can be deleted to free up space because it is not needed to mitigate the defectivity. In some memory sub-systems, when defectivity scans result in the detection of defects (e.g., identification of defective location on the memory device) the redundancy and fault tolerance provided by various RAIN schemes can be used to recover the data that was stored on the defective location and mitigate the defect. For example, in a memory sub-system that implements a permanent parity RAIN scheme or a temporary parity RAIN scheme, the sub-system can use the parity metadata to recover the data that was stored on the defective location and store it in another location (e.g., another memory device, die, plane, block, page, etc.) or store it as part of another fault tolerant data stripe. Similarly, in a memory sub-system that implements a parity-less RAIN scheme, whenever a defectivity scan detects defects indicative of the number of defective pages in a given RAIN stripe exceeding the maximum permitted number, the memory sub-system can notify the host system and rewrite the data affected by the defective in another RAIN stripe to maintain the minimum number of accessible redundant copies of the data.

However, to determine whether RAIN parity metadata can be deleted to free up space in a memory sub-system that implements a temporary parity RAIN scheme or to determine whether a host system's fault tolerance requirements are being met in a memory sub-system that implements a parity-less RAIN scheme, defectivity scans need to be performed on a frequent and recurring basis. These defectivity scans, such as a Write Immediate Read (WIR) RBER scan that measures an RBER of a location on a memory device soon after data is written to it, often take up significant amounts of time and drain sub-system power and resources. Moreover, such scans also increase overall latency by delaying the execution of host operations and thereby decrease data throughput between the host system and the memory device(s). In some cases, the time required to perform a scan can be decreased by reducing the accuracy of the scan. However, the overall result of such an approach can be detrimental as the decreased scan accuracy can result in a higher number of erroneously detected defects (i.e., false positive detection of defective locations) leading to the unnecessary performance of remedial operations (e.g., the aforementioned rewrites of the data to other locations) to remedy the detected defects that don't actually exist on the memory device. Moreover, in systems that implement a temporary parity RAIN scheme, erroneous detection of defects can cause the temporary parity metadata to be retained and consequently reduce the amount of available space on the memory device for other data to be stored.

Aspects of the present disclosure address the above and other deficiencies by performing a multi-tiered defectivity scan to determine defects present on an MU of a memory device while limiting the time and resources consumed. More specifically, WIR RBER scanning can include multiple tiers of scans where a scan of a higher tier (also referred to here as a "higher tier scan") is performed when the scan of a lower tier (also referred to here as a "lower tier scan") was not sufficient to determine a defect. For the purposes of this disclosure, as explained in more detail below, a scan that uses a parameter (e.g., a parameter indicating a maximum time for a read operation) that is lower than the default parameter can be referred to as a lower tier scan. Conversely, a scan that uses a parameter (e.g., a parameter indicating a maximum time for a read operation) that is higher than the parameter used in a lower tier scan can be referred to as a higher tier scan. The scans of different tiers respectively take different amounts of time to complete and can measure the RBER with different respective levels of accuracy (i.e., determine the presence of defects with different levels of accuracy). A lower tier scan can be performed with one set of parameters that ensure that the scan is completed more quickly than a higher tier scan (e.g., a scan using default parameters). If a lower tier scan with a lower level of accuracy of determining a presence of defects indicates that no defects are present, then a higher tier scan may be avoided. In instances when the lower tier scan indicates the presence of defects, a higher tier scan with a higher level of accuracy of determining a presence of defects can be performed to verify the indication of the lower tier scan. A comparison of a measured RBER with a threshold RBER value can be used to determine whether the measured RBER indicates a defect as well as to determine whether to perform a higher tier scan.

Advantages of the present disclosure include reducing the amount of resources and time that defectivity scanning, such as WIR RBER scanning, consumes and reducing the latency of the overall operation of the memory device. The various tiers of scans can be configured with parameters that ensure that the scans at each tier indicate the absence of defects as effectively as a scan with default parameters (also referred to here as a "default scan") and that the scans at each tier are quicker or just as quick as a default scan. By initially performing a lower tier scan, a subsequent higher tier scan can be avoided in cases where the lower tier scan provides a sufficiently reliable indication. Because a lower tier scan can operate under parameters that cause it to be completed more quickly and with less energy and resources than a default scan or a higher tier scan, the overall speed of the memory device is increased while decreasing power consumption. Since an area being scanned on a memory device becomes unavailable for other operations, having scans be performed more quickly increases the availability of the memory device for host system operations, increases overall throughput, and decreases latency. Furthermore, performing a higher tier scan after an indication of a presence of a defect by a lower tier scan can minimize residual misdetection of defects and minimize unnecessary rewrites of data from locations that are affected by erroneously detected defects. Thus, as explained in more detail below, the embodiments described in this disclosure improve the performance of memory devices while maintaining a level of defect detection reliability.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dies and/or channels to form management units (MUs). In some embodiments, an MU can refer to a memory cell, a set of cells connected to a wordline, a page, a block, or a combination of one or more of the foregoing. An MU can refer to set of one or more individual segments of the memory device 130 that can be written or erased in a single operation. For example, memory device 130 can be divided into multiple MUs, where each MU includes one or more blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. In some embodiments, local memory 119 can include static random access memory (SRAM). While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a scan management component 113 that can perform multi-tiered defectivity scans on memory device 130 to detect defects in areas on the memory device. In several embodiments, the scan management component 113 can manage the implementation of a fault tolerant RAIN scheme on the memory device 130 and manage the redundancy data of the implemented RAIN scheme (e.g., duplicate portions of data, parity metadata, etc. associated with a fault tolerant stripe, all such data collectively referred to herein as "RAIN metadata") on the memory sub-system 110 (e.g., in the local memory 119, memory device 130, and/or memory device 140). In some embodiments, the memory sub-system controller 115 includes at least a portion of the scan management component 113. In some embodiments, the scan management component 113 is part of the host system 110, an application, or an operating system. In other embodiments, local media controller 135 includes at least a portion of scan management component 113 and is configured to perform the functionality described herein.

The scan management component 113 can, in some embodiments, implement one or more RAIN schemes on the memory device 130. For example, the scan management component 113 can implement a permanent parity RAIN scheme, a temporary parity RAIN scheme, a parity-less RAIN scheme, or a combination of multiple RAIN schemes on areas or MUs of the memory device 130. In some cases, the type of RAIN scheme implemented by the scan management component 113 can be determined by a setting a parameter (e.g., a RAIN scheme parameter) to a value corresponding to one of the described RAIN schemes. For example, the scan management component 113 can detect the value that the RAIN scheme parameter is set to on the memory sub-system controller 115 and implement a corresponding RAIN scheme. As will be described in more detail with reference to FIGS. 2A-2C, based on indications provided by a defectivity scan, scan management component 113 can use the RAIN metadata to recover and restore data and can delete RAIN metadata (e.g., temporary parity metadata) that is not needed. For example, the scan management component 113 can use the RAIN metadata to restore data affected by a defect that was detected by a defectivity scan on the memory device 130. Conversely, in some embodiments, the scan management component 113 can determine that, due to an absence of a defect, RAIN metadata is not needed to restore or recover data. In some cases, the RAIN metadata can be deleted based on a defectivity scan indicating that the data in the scanned MU is unaffected by defects. As used herein, the terms "scan" and "defectivity scan" can include a data integrity scan that measures an RBER such as a WIR RBER of the data of the MU scanned on the memory device 130.

Accordingly, in the several embodiments, the scan management component ("SMC") 113 can write data to one or to multiple memory devices 130, 140. For example, SMC 113 can write data, for example data received by the memory sub-system 110 from host 120 (such data referred to herein as "host data") and system metadata created by the memory-sub-system 110 (such data referred to herein as "system metadata") to the memory device 130. For the purposes of this disclosure, host data and system data can collectively be referred to as system data. If one or more RAIN schemes has been selected for use on the various data storage components (e.g., memory device 130) in the memory sub-system 110, the SMC 113 can write the system data to the memory device 130 in accordance with the applicable RAIN scheme by storing the system data on the memory device 130 along with RAIN metadata (i.e., redundant duplicated portions of the system data or redundancy metadata (e.g., parity metadata)). In some embodiments, the SMC 113 can store the RAIN metadata on the same memory device as the host data, while in other embodiments, the SMC 113 can store system data in one location (e.g., an area on memory device 130) and store corresponding RAIN metadata in a different location (e.g., in local memory 119, on memory device 140, or in another area on memory device 130). Accordingly, the SMC 113 can store portions of a fault tolerant data stripe (e.g., portions containing RAIN metadata) in different locations than other portions of the same stripe, such that if the different locations are on different memory devices 130, 140 a single stripe can be considered to be stored across multiple devices.

When data has been written and is stored in one or more memory devices 130, 140, the SMC 113 can operate in the following general manner in accordance with the various embodiments described herein. The SMC 113 can perform one or more scan operations on the MU containing the data to determine the current value of a data state metric (e.g., a measure or indicator of the integrity of the data stored on a defined area on the memory device 130.). The metric measured by the data scan can be chosen based on the quality of its correlation with a target memory device performance characteristic. Each scan operation can be performed using a corresponding value of a read-time parameter (e.g., read access time parameter, precision parameter for applying particular voltage levels, ramping time parameter defining a voltage ramping period) that controls the duration of read operations being performed during the scan. The SMC 113 can determine whether the current value of the chosen data state metric satisfies a criterion with respect to a threshold value of the chosen data state metric. Consequently, based on whether or not the criterion is satisfied, the SMC 113 selects a remedial operation (e.g., by determining whether redundancy metadata is present on the one or more memory devices). The SMC 113 can then perform a remedial operation with respect to the MU (e.g., block) containing the data on the memory device 130. In some embodiments, the SMC 113 can select, among a variety of potential operations, the type of remedial operation to perform based on the presence of redundancy metadata (i.e., RAIN metadata) is included in a fault tolerant data stripe. Further details with regards to these generally described operations of the scan management component 113 are explained below.

As noted above, in some embodiments, the SMC 113 can perform multiple tiers of defectivity scan operations to determine a value of a data state metric. For example, the data state metric can be an error count, a deviation of a threshold voltage reflective of a boundary between memory cell programming states, an error rate (e.g., an RBER), as well as other measures and indicators or combinations of them. In some embodiments, the SMC 113 can perform the scan on the MU containing the written data and can determine an RBER resulting from the scan. For example, the scan can include the SMC 113 performing read operations on memory cells in a specified area (e.g., a set of memory cells or a group of pages) on the memory device or a portion (e.g., die, plane, block) of the device and calculating an RBER for the operations performed during the scan.

In some embodiments, the performance of each scan operation by the SMC 113 can be controlled using various parameters that characterize some of the operations of the scan. For example, the duration and accuracy of a scan can be controlled by changing a value of the read-time parameter (also referred to herein as a "read-time parameter value"), such as the read access time ("tR") that determines the time within which a particular read operation should be completed. In certain memory devices, including non-volatile memory devices such as NAND memory devices 130, tR can be determined by three phases of read accesses operations. These phases include, for example, (i) a pass voltage ($V_{pass}$) time in which voltages of the wordlines of an array of memory cells are ramped up, (ii) a sensing time to perform the actual read of data stored in the memory cells of the array, and (iii) a prologue or epilogue time in which the voltage levels are at least partially discharged or other type of recovery from the read operation is performed. Accordingly, in some embodiments, the tR can depend on the amount of time allotted for the bitlines/wordlines to charge (i.e., ramp up voltage). In turn, a particular tR can be determined by the level of precision used for applying particular voltage levels, along respective wordlines and bitlines, to memory cells during the performance of read operations. In other words, the value of the tR parameter (also referred to herein as a "tR parameter value") can be defined by the duration of a voltage ramping period of a read access operation. As used herein, the level of precision refers to a measure of a difference (i.e., in volts) between the voltage applied to a component of the memory device and the target voltage desired to be applied. Because increasing the tR for operations allows the voltage to be ramped up more gradually to bring the applied voltage close to the target voltage level, doing so can lead to a more accurate measure of RBER (i.e., the target voltage is reached with more precision). Conversely, decreasing the tR limits the time and entails a more rapid voltage ramping that leads to less precision in reaching the target voltage levels, and consequently results in a less accurate measure of RBER.

Thus, by varying or selecting different values of the tR parameter, the SMC 113 can vary the speed with which different tiers of defectivity scan operations are performed. Generally, the SMC 113 can use a default value of the tR parameter to perform a defectivity scan (such scan referred to herein as a "default scan"), such that the default value achieves a corresponding desired level of scan accuracy. For example, a value of the tR parameter that is lower than the default value of the tR parameter can be used to perform a defectivity scan that is faster than the default scan (such scan referred to herein as a "lower tier scan" or "fast scan"). This lower tier scan can result in a lower RBER measurement accuracy relative to the RBER measurement accuracy of the default scan. Similarly, a value of the tR parameter that is higher than the value used for the lower tier scan, but lower than the default value of the tR parameter, can be used to perform a defectivity scan that is slower than the lower tier scan, but faster than the default scan (such scan referred to herein as a "higher tier scan" or "slow scan"). This slow scan can result in a lower RBER measurement accuracy relative to the RBER measurement accuracy of the default scan, but a higher RBER measurement accuracy relative to the RBER measurement accuracy of the fast scan.

Accordingly, in some embodiments, the SMC 113 can have predetermined default values of the tR parameter and corresponding desired levels of voltage application precision for performing default scan operations. Accordingly, by using a tR parameter value that is lower than a pre-determined default tR parameter value, the SMC 113 can perform a lower tier scan that takes less time to complete than the default scan. More generally, in several embodiments, the SMC 113 can use relatively lower tR parameter values to perform relatively faster scan operations and can use relatively higher parameter values to perform slower scan operations. Thus, a scan performed using a lower tR parameter value can typically result in a higher RBER measurement than the same scan being performed using a higher tR parameter value.

Accordingly, in some embodiments, the SMC 113 can initially perform a scan using a pre-determined value of the read-time parameter that is lower than a default value of the parameter. The SMC 113 can also determine the initial value of a chosen data state metric resulting from the scan.

In some embodiments, the SMC 113 can determine whether the initial value of the chosen data state metric satisfies a criterion with respect to a threshold value of the data state metric. Accordingly, since the metric scan can be chosen based on the quality of its correlation with a memory device performance characteristic, the threshold value of the chosen data state metric can correspond to a particular target measure of that characteristic. In some cases, the criterion can be defined to be satisfied when the initial value exceeds the threshold value. In other cases, the criterion can be defined to be satisfied when the initial value is less than the threshold value. For example, the SMC 113 can compare the RBER value obtained by the initial scan (i.e., the initial RBER value) with a threshold RBER value and determine that the measured RBER value satisfies the criterion because the measured RBER value exceeds the threshold RBER value. Conversely, the SMC 113 can determine that the RBER value is lower than the threshold RBER value and therefore does not satisfy the condition. In some embodiments, the threshold RBER value can be set to a value indicative of a defect in the area of the scan. Accordingly, a lack of defect in the scanned area can result in a measured RBER value being lower than the threshold RBER value, while a defect in the scanned area can result in a measured RBER value being higher than the threshold RBER value. Thus, a scan resulting in an RBER value less than the threshold value can be indicative of a lack of defects, while a scan resulting in an RBER value that is higher than the threshold value can be indicative of a presence of defects.

Therefore, in some embodiments, if the value of the chosen data state metric does not satisfy the criterion, the SMC 113 can determine that no defect is present. For example, the SMC 113 can determine that, since the RBER value measured by the initial scan (i.e., a scan that uses a lower tR value than a default tR value) is lower than the threshold RBER value, a remedial operation does not need to be performed. Alternatively, if the value of the chosen data state metric does satisfy the criterion, the SMC 113 can determine that a defect might be present.

To reduce the occurrence of false positive detection of defects, the SMC 113 can proceed to perform a more accurate scan using a different value of the read-time parameter to verify the indication of the initial scan that a defect is present. Accordingly, in some embodiments, the SMC 113 can determine that an RBER value resulting from the initial scan exceeds a threshold RBER value and, in response, perform a subsequent scan using a higher tR value than the tR value used for the initial scan.

Thus, the SMC 113 can determine whether the subsequent value of the chosen data state metric satisfies a criterion with respect to a threshold value of the chosen data state metric. Similarly, to the initial scan, the SMC 113 can determine the subsequent RBER value resulting from the subsequent scan and determine whether it satisfies a criterion with respect to a threshold RBER value. As described earlier, the criterion can be defined to be satisfied when the subsequent value of the data state metric exceeds the threshold value. In other cases, the criterion can be defined to be satisfied when the subsequent value of the data state metric is less than the threshold value. For example, the SMC 113 can compare the RBER value obtained by the subsequent scan (i.e., the subsequent RBER value) with a threshold RBER value and determine that the measured RBER value satisfies the criterion because the measured RBER value exceeds the threshold RBER value. Conversely, the SMC 113 can determine that the RBER value is lower than the threshold RBER value and therefore does not satisfy the condition. In some cases, the criterion and the threshold value used for this determination after the subsequent scan can be the same as those used after the initial scan, while in other cases, different criteria and threshold values can be used. In some embodiments, because the SMC 113 performs the subsequent scan using a higher tR value, the resulting RBER value from the subsequent scan can provide a more accurate indication of the presence of defects than the RBER value resulting from the initial scan.

Therefore, in some embodiments, if the value of the chosen data state metric obtained as a result of the subsequent scan does not satisfy the criterion, the SMC 113 can correct the indication of the initial scan by determining that no defect is present and can proceed to write more data to the memory device 130. For example, the SMC 113 can determine that, since the RBER value measured by the subsequent scan (i.e., a scan that uses a higher tR value than a tR value used in a preceding scan) is lower than the threshold RBER value, a remedial operation does not need to be performed. Alternatively, if the value of the chosen data state metric does satisfy the criterion, the SMC 113 can verify the indication of the initial scan and determine that a defect is present. For example, the SMC 113 can determine that, the RBER value measured by the subsequent scan is higher than the threshold RBER value which is indicative of a defect. As described in more detail below, the SMC 113 can address the detection of the defect by performing operations to remedy the integrity of the data affected by the defect.

In some embodiments, responsive to determining that the subsequent value of the chosen data state metric satisfies the criterion the SMC 113 can select a remedial operation (e.g., by determining whether or not redundancy metadata is found on the one or more memory devices). Then, the SMC 113 can perform the remedial operation with respect to the area (e.g., MU) containing the scanned data on the memory device 130. For example, the SMC 113 can perform a remedial operation on the MU (e.g., block) containing the data. In some embodiments, the type of remedial operation that is selected for the SMC 113 to perform can be contingent on the presence of RAIN metadata (e.g., redundancy metadata or redundant duplicate data portions) is included in a fault tolerant data stripe. Portions of the same fault tolerant data stripe can be stored in different locations on the same device or on different memory devices. Accordingly, to select a remedial operation to perform, the SMC 113 can determine whether redundancy metadata is included in a fault tolerant stripe on the memory device 130 or in a fault tolerant stripe having pages stored on multiple memory devices 130, 140. Determining which remedial operation to perform can depend on whether the memory sub-system 110 is implementing any RAIN scheme and, if it is, can further depend on the type of RAIN scheme that it is implementing.

In some embodiments, a permanent parity RAIN scheme or temporary parity RAIN scheme can be implemented, while in others a parity-less RAIN scheme can be implemented. Considering that the RAIN metadata utilized by the former two schemes is redundancy metadata while the RAIN metadata utilized by the latter scheme is duplicate redundant portions of host data, detection of redundancy metadata in a fault tolerant strip is indicative of one of the two former schemes being implemented and not the latter scheme. In these embodiments, the SMC 113 can determine whether redundancy metadata (e.g., parity metadata) is included in a fault tolerant stripe on one or more devices. In some cases, the SMC 113 can detect the value that the RAIN scheme parameter is set to on the memory sub-system controller 115 whether a RAIN scheme is implemented with respect to a particular data location. Therefore, the SMC 113 can determine, based on the RAIN scheme parameter setting, whether redundancy metadata (e.g., parity metadata) associated with specified data exists in a particular location. Responsive to determining that redundancy metadata (e.g., parity metadata) is included in a fault tolerant stripe on one or more devices, the SMC 113 can recover the data affected by the defect by using the redundancy metadata. For example, if a portion of the data stored on a page in a fault tolerant stripe is affected by the detected defect, the SMC 113 can use the redundancy metadata from the fault tolerant stripe to recover the portion of the data that was stored in the affected page and can rewrite the data in another location (e.g., on the same or different device).

In some embodiments that implement a parity-less RAIN scheme, the SMC 113 can perform a different remedial operation. For example, responsive to determining that redundancy metadata (e.g., parity metadata) is not included in a fault tolerant stripe on one or more devices, the SMC 113 can determine whether duplicate portions of system data are included in a fault tolerant stripe on one or more devices. In some embodiments, responsive to determining that duplicate portions of system data are included in a fault tolerant stripe on one or more devices, the SMC 113 can notify the host system 120 that (due to the detected defect) certain logical addresses correspond to an unreliable area (e.g., MU) on the physical medium of the memory device 130 where the portion of the system data was stored are. More specifically, in some embodiment, the SMC 113 can notify the host system 120 that logical addresses within a specified range of logical addresses correspond to an unreliable MU (e.g., block) on the memory device (since it is affected by the defect). Thus, the SMC 113 can notify the host system that fault tolerance requirements of the host systems are violated. In some cases, the fault tolerance requirements can include a minimum value of a data redundancy metric, which can be a metric that indicates an amount of redundant duplicate copies of data portions stored in each fault tolerant stripe on the memory devices 130, 140. For example, a defect on a plane on the memory device 130 can cause a page where a copy of a portion system data is stored to be unreliable. Accordingly, if that page was one of the pages in a fault tolerant stripe that initially contained the minimum six redundant copies of identical portions of system data as dictated by the host system's 120 fault tolerance requirements, then the loss of reliability for that page would constitute a violation of those requirements.

Thus, the SMC 113 can notify the host system that the amount of reliably accessible duplicate copies of portions of system data in a fault tolerant stripe is below a threshold amount defined by the host system's 120 requirements. In some embodiments, the host system 120 can send a command to the memory sub-system 110 to perform a remedial operation that remedies the violation of the requirements by, for example, rewriting the portion of system data or all of the system data stored in the affected MU (e.g., page, block) to another location. In response to the sub-system 110 or the SMC 113 receiving the command from the host system 120, the SMC 113 can recover the portion of the system data stored on the affected area by using the other duplicate portions of the data in the fault tolerant stripe and rewrite the portion of the data or the entire stripe in another location (e.g., a different location on the same device, or on one or more different memory devices). Thus, depending on the presence of RAIN metadata on one or more memory devices 130, 140 and the type of RAIN metadata included in a fault tolerant stripe, different remedial operations can be taken to address the detection of defects by the multi-tiered scan in the several embodiments described herein. Implementations of the various RAIN schemes and defectivity scan parameters mentioned above are described in more detail below with reference to FIGS. 2A-2C.

Figure 2A:
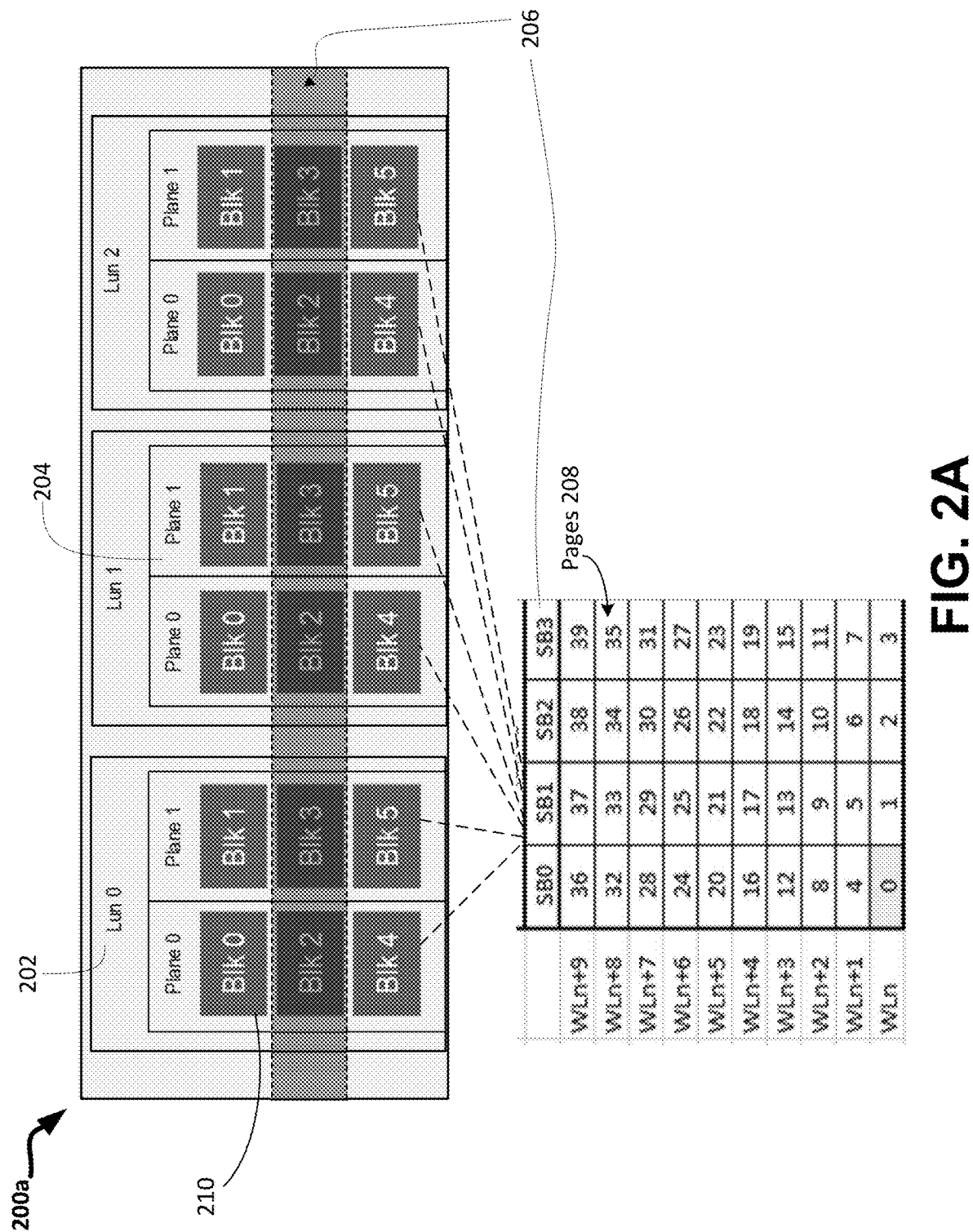
FIG. 2A is a schematic diagram of an example layout of a memory device in accordance with some embodiments of the present disclosure.

FIG. 2A is a schematic diagram of an example layout 200a of a memory device in accordance with some embodiments of the present disclosure. In some embodiments, system data can be stored on a memory device (e.g., memory device 130 of FIG. 1), which can include multiple logical units ("LUNs") 202. In some cases, each LUN can correspond to a respective die of the memory device, where each die can include multiple planes 204 and each plane 204 can be divided into blocks 210. Accordingly, in some embodiments, each LUN can include multiple blocks 210 each of which that reside on a corresponding plane 204. Each block 210 can include multiple pages 208 that can be grouped by respective wordlines. In some cases, the wordlines and corresponding groups of can be identified according to a wordline index number such that a range of wordlines can be generally represented in the form $WL_n$-$WL_{n+k}$. In some embodiments, program and/or erase operations can be simultaneously performed on two or more pages 208, if each page is located on a different respective plane.

In some embodiments, multiple blocks 210 can be logically combined to form a management unit called a superblock ("SB") 206 (e.g., SB0-SB3). Each SB can be defined to include at least one block 210 from each plane 204 of each LUN 202 of the memory device. Programming operations with respect to the memory device can sequentially be performed on respective SBs 206, by, for example, writing the system data to the pages 208 of one SB 206 after writing the system data to the pages 208 of another SB 206. In some embodiments, the system data can be stored on the memory device in a fault tolerant manner as explained in more detail with reference to FIG. 2B.

Figure 2B:
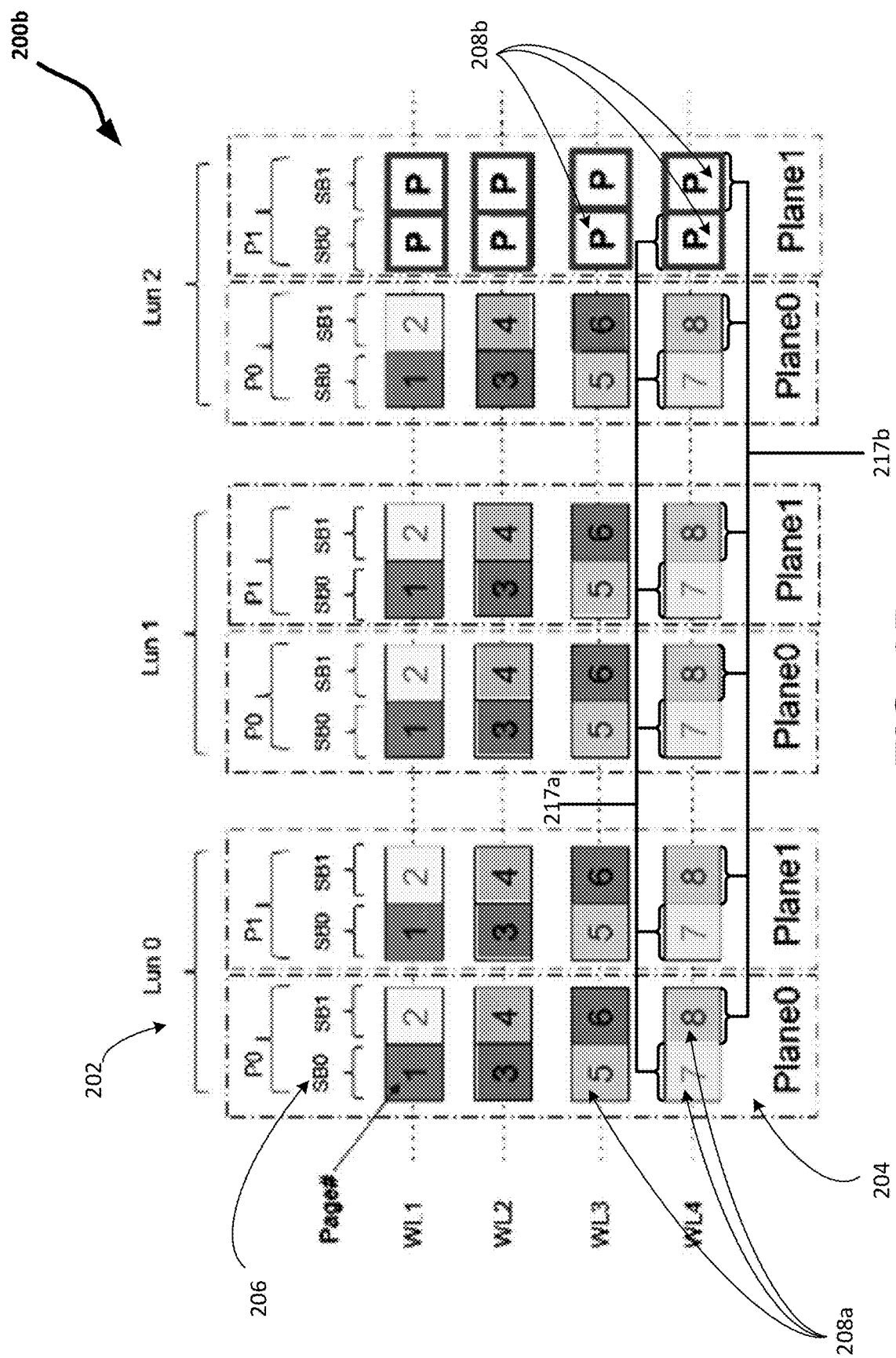
FIG. 2B is a schematic diagram of an example fault tolerant layout of a memory device in accordance with some embodiments of the present disclosure.

FIG. 2B is a schematic diagram of an example fault tolerant layout 200b of a memory device in accordance with some embodiments of the present disclosure. In some embodiments, the system data can be stored (e.g., by subsystem controller 115 of FIG. 1) on a memory device in a fault tolerant manner, by writing the system data sequentially to one page 208 after another, such that the pages 208 are grouped into fault tolerant stripes 217a, 217b. Each fault tolerant stripe 217a, 217b can include a certain number of data pages (i.e., pages that store host data) 208a and a redundancy metadata page 208b that stores the metadata to be used for error detection and recovery. In some embodiments that implement a permanent parity RAIN scheme or a temporary parity RAIN scheme, the redundancy metadata can be represented by parity metadata, such that each bit of the metadata page 208b of a fault tolerant stripe 2017 can be produced by performing a bitwise exclusive disjunction (an "XOR") operation of respective bits of data pages 208a of the fault tolerant stripe. Such a redundancy scheme can provide fault tolerance in situations when no more than one page 208 of a given fault tolerant stripe 217a, 217b is affected by a defect or otherwise becomes faulty. In some embodiments, the data stored in the page prior to it becoming faulty can be recovered or reconstructed by performing an XOR operation on all the remaining data pages 208a and the metadata page 208b in the stripe 217a, 217b.

Since the presence of one faulty page on a given wordline can be indicative of other pages on the same wordline being also faulty, in some embodiments, no pages 208 sharing one or more adjacent wordlines within a single plane 204 of any given LUN 202 can be present in a fault tolerant stripe 217a, 217b, because such fault tolerant RAIN schemes can recover no more than one faulty page 208 per fault tolerant stripe 217a, 217b. In other words, no more than one page 208 from any given wordline of any given plane 204 of a LUN can be present in a fault tolerant stripe 217a, 217b. Thus, in some embodiments, a fault tolerant stripe 217a, 217b can include a pages (i.e., pages 208a) of the fault tolerant stripe 217a, 217b are used to store the host data, while the remaining page (i.e., page 208b) is used to store the redundancy metadata.

For example, one fault tolerant stripe 217a can be formed by pages having the first number within its plane (e.g., pages #7) across the plains 204 and logical units 202 of the memory device, such that all but one pages (i.e., all of pages 208a and excluding page 208b) of the fault tolerant stripe are utilized to store the host data, while the last page 208b is used to store the redundancy metadata for the fault tolerant stripe. Another fault tolerant stripe 217b can be formed by pages 208 having the second number within its plane (e.g., pages #8) across the plains 204 and logical units 202 of the memory device, such that all but one pages (i.e., all of pages 208a and excluding page 208b) of the fault tolerant stripe are utilized to store the host data, while the last page 208b is used to store the redundancy metadata for the fault tolerant stripe.

In some embodiments, other RAIN schemes can be used such as parity-less RAIN schemes that do not use redundancy metadata and, instead, form fault tolerant stripes 217a, 217b by using duplicate redundant copies of portions of host data. For example, in a system using a parity-less RAIN scheme, system data can be stored on a memory device in a fault tolerant manner by writing identical duplicate copies of portions of the system data in respective pages 208a, 208b in a stripe 217a, 217b. The number of duplicate copies of system data portions that need to be reliably accessible can be defined by host system fault tolerance requirements. For example, in an embodiment where the host fault tolerance requirements dictate that six duplicate copies of system data portions need to be reliably accessible on the memory device at all time, a parity RAID scheme implementation can include storing an identical duplicate copy of a portion of system data on each page 208 (i.e., 208a and 208b) of a fault tolerant stripe 217a, 217b. This type of a redundancy scheme can provide fault tolerance in situations when at least one page 208 of a given fault tolerant stripe 217a, 217b is unaffected by a defect or otherwise remains reliably accessible. Accordingly, in some embodiments, the data portion stored in a page prior to the page becoming faulty can be recovered or reconstructed by copying the data portion from any of the other unaffected pages 208a, 208b in the stripe 217a, 217b. The numbers of LUNs 202, planes 204, pages 208, wordlines, and fault tolerant stripes 217a, 217b in the illustrative example of FIG. 2B are chosen for illustrative purposes and are not limiting, other embodiments can use various other numbers of LUNs 202, planes 204, pages 208, wordlines, and fault tolerant stripes 217a, 217b. Further, while some embodiments can manage scans (e.g., by SMC 113 of FIG. 1) on a memory device having RAIN stripes such as those of the example fault tolerant layout 200b that implements a permanent RAIN scheme (i.e., where RAIN metadata is stored on the same memory device as system data) as illustrated in FIG. 2B, the same or other embodiments can mange scans (e.g., by SMC 113 of FIG. 1) on a memory device having RAIN stripes of an analogous fault tolerant layout that implements a temporary RAIN scheme (i.e., where RAIN metadata is stored temporarily in a different location as system data). In some of these embodiments, the RAIN metadata can be retained until (i.e., deleted after) the system data associated with the RAIN metadata on a particular MU is determined to be free of defects after a scan is performed.

Figure 2C:
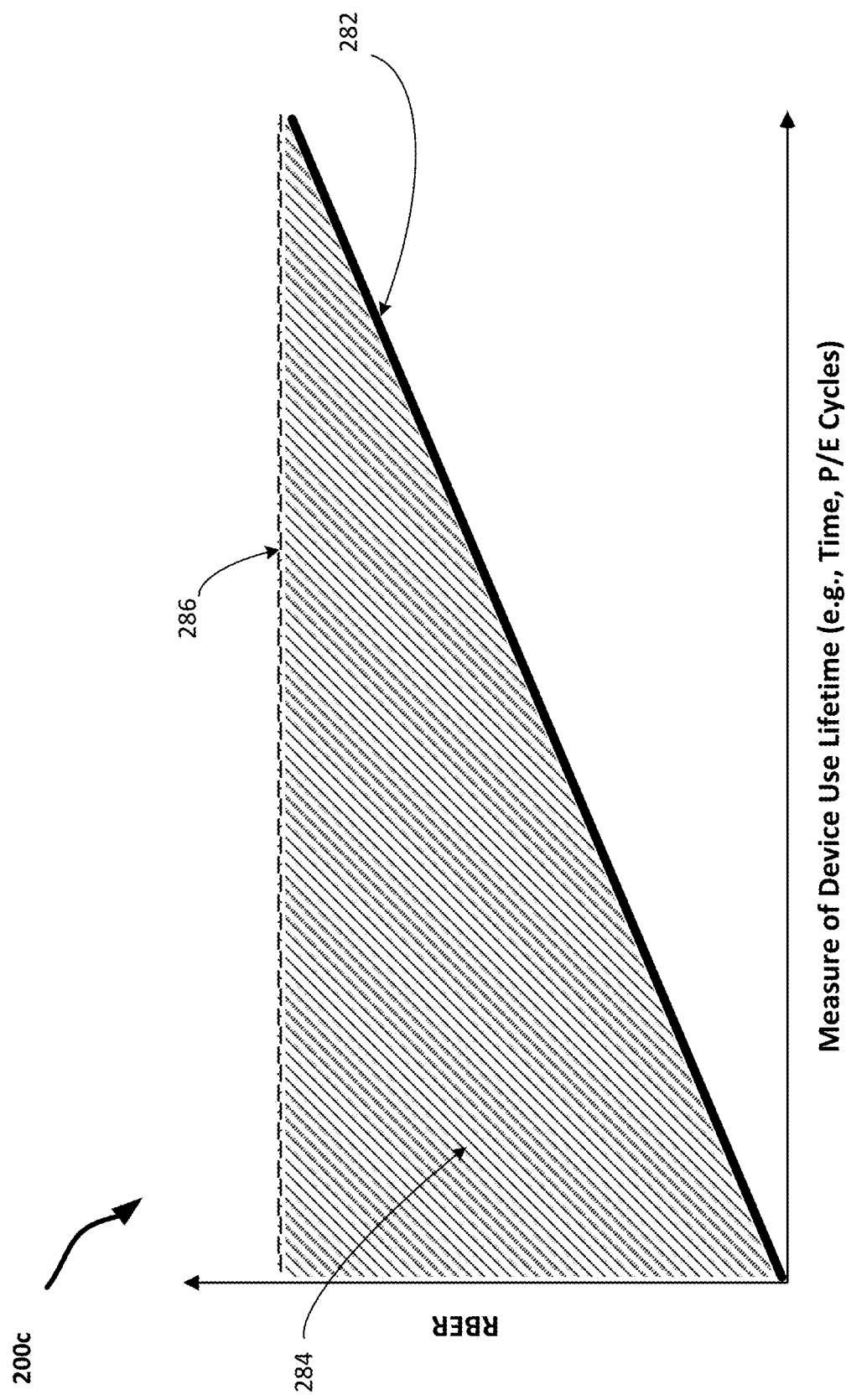
FIG. 2C depicts a graph of a raw bit error rate (RBER) as a function of device use lifetime, in accordance with some embodiments of the present disclosure.

FIG. 2C depicts a graph 200c of a raw bit error rate (RBER) as a function of device use lifetime, in accordance with some embodiments of the present disclosure. The device use lifetime can be measured in terms of a duration of elapsed time since the device began being used or in terms of a number of program-erase (P/E) cycles performed on the device. The RBER can be measured in terms of a count or percentage of errors occurring during the performance of a media access operation on the memory device.

Thus, the plot 282 approximately represents a theoretical RBER that can be expected to occur during the performance of media access operations (e.g., read operations performed using a pre-determined value of the tR parameter) as the memory device continues to be used. As can be seen, with continued use, the RBER resulting from the performance of media access operations can be expected to increase.

Further, the threshold RBER value marked by line 286 can be representative of a maximum RBER that can be corrected by error-correction code (ECC) operations. Accordingly, in some embodiments, the threshold value of the chosen data state metric can be defined by maximum value of the chosen data state metric for which an error correction code (ECC) operation is capable of correcting errors that occur when the data is read. Therefore, memory access operations such as the read operations performed during a defectivity scan can result in RBER values that can be either higher or lower than the threshold RBER value marked by line 286. In some embodiments, the threshold RBER value marked by line 286 can be defined to be indicative of a presence of a defect in the area (e.g., MU) being scanned. Therefore, a scan resulting in an RBER value exceeding the threshold RBER value marked by line 286 can indicate a defect while a scan resulting in an RBER value lower the threshold RBER can be indicative of an absence of a defect.

Additionally, as noted above, varying tR parameter values used during scan operations can result in measured RBER values of different accuracy. For example, using a lower value of the tR parameter to perform operations during a defectivity scan can result in the defectivity scan being completed faster but also result in a less accurate resulting RBER value (e.g., measuring the RBER to be higher than if the same scan was performed with a higher value of the tR parameter). Conversely, using a higher value of the tR parameter to perform operations during a defectivity scan can result in the defectivity scan being completed faster but also result in a more accurate resulting RBER value. Noting that for a duration of a portion of the lifetime of a memory device, the theoretically expected RBER obtained from scan operations using default parameter values (e.g., defectivity scans with read operations performed using a pre-determined tR parameter value) is below the threshold RBER value marked by line 286, a hatched margin 284 can represent range of RBER values that would not be indicative of a presence of a defect. Accordingly, even considering the reduced accuracy and potentially erroneous higher RBER measurements obtained from scan operations using a higher value of the tR parameter than a default value of the tR parameter, there exists a range of time durations to which the tR parameter value can be set without having a theoretical resulting RBER measurement exceed the threshold value if a defect is not present. Therefore, in some embodiments, at a specified point of a memory device lifetime, the value of the tR parameter used during one or more defectivity scans can be selected from the tR parameter value range corresponding to the theoretical resulting RBER range reflected by the margin 284.

Figure 3:
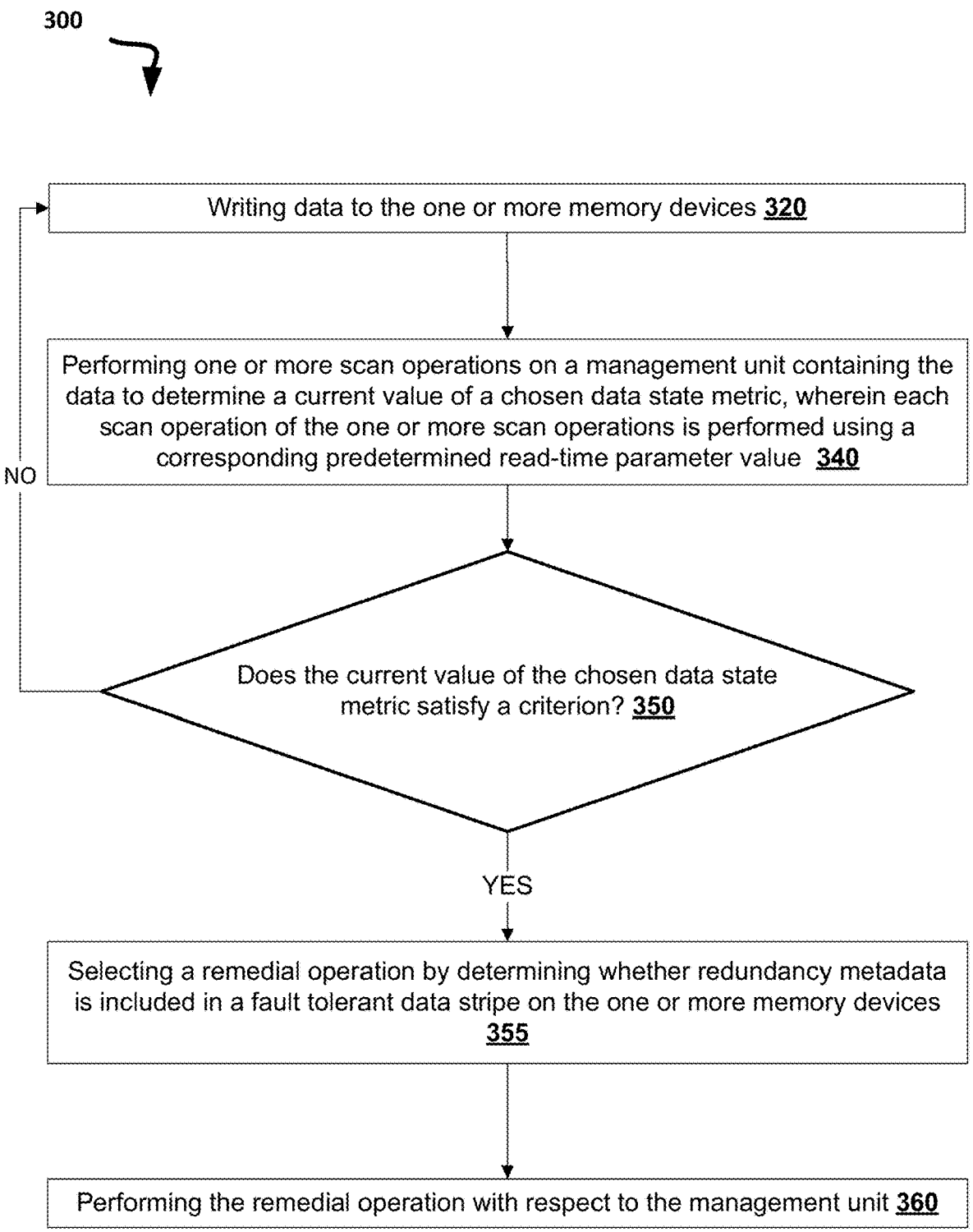
FIG. 3 is flow diagram of an example method for performing multi-tiered defect scan management on memory devices in accordance with some embodiments of the present disclosure.

FIG. 3 is flow diagram of an example method 300 for performing multi-tiered defect scan management on memory devices in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan management component (SMC) 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments of the present disclosure, at operation 320, the processing logic can write data to one or more memory devices (e.g., memory devices 130, 140 of FIG. 1). At operation 340, the processing logic can perform one or more scan operation operations on the MU containing the data to determine a current value of a chosen data state metric. In some embodiments, the processing logic can perform each scan operation using a corresponding predetermined value of the read-time parameter. For example, the scan operations can be defectivity scans that determine a Write Immediate Read (WIR) Raw Bit Error Rate (RBER) as described earlier. In some cases, each scan operation can be performed using a different read value of the access time (tR) parameter that controls the duration of read operations during the scan. Accordingly, in some embodiments, the processing logic can perform one or more defectivity scan operations to determine a resulting RBER value.

In some embodiments, at operation 350, the processing logic can determine whether the current value of the chosen data state metric satisfies a criterion (e.g., with respect to a threshold value of the chosen data state metric). In some cases, the criterion can be defined to be satisfied if the current value exceeds the threshold value. In other cases, the criterion can be defined to be satisfied if the current value is below the threshold value. For example, the processing logic can determine whether a resulting RBER value obtained from the one or more scan operations exceeds a predetermined threshold RBER value.

In several embodiments, responsive to determining that the current value of the chosen data state metric does not satisfy the criterion, the processing logic can determine that no defect is detected. Alternatively, responsive to determining that the current value of the chosen data state metric satisfies the criterion, at operation 355, the processing logic can, select a remedial operation (e.g., by determining whether redundancy metadata is present on the one or more memory devices). At operation 360, the processing logic can perform a remedial operation with respect to the location of the MU (e.g., a page, a block) containing the data on its respective memory device. In some embodiments, the type of remedial operation selected at operation 355 to be performed at operation 360 can be contingent on RAIN metadata (e.g., redundancy metadata) being included in a fault tolerant data stripe on the one or more memory devices. In other words, in some cases, the processing logic can perform one of a variety of remedial operations depending on whether or not redundancy metadata is present in a fault tolerant stripe having pages stored in one or more memory devices. Additional details of multi-tiered defect scan management on memory devices are provided below with reference to FIG. 4.

Figure 4:
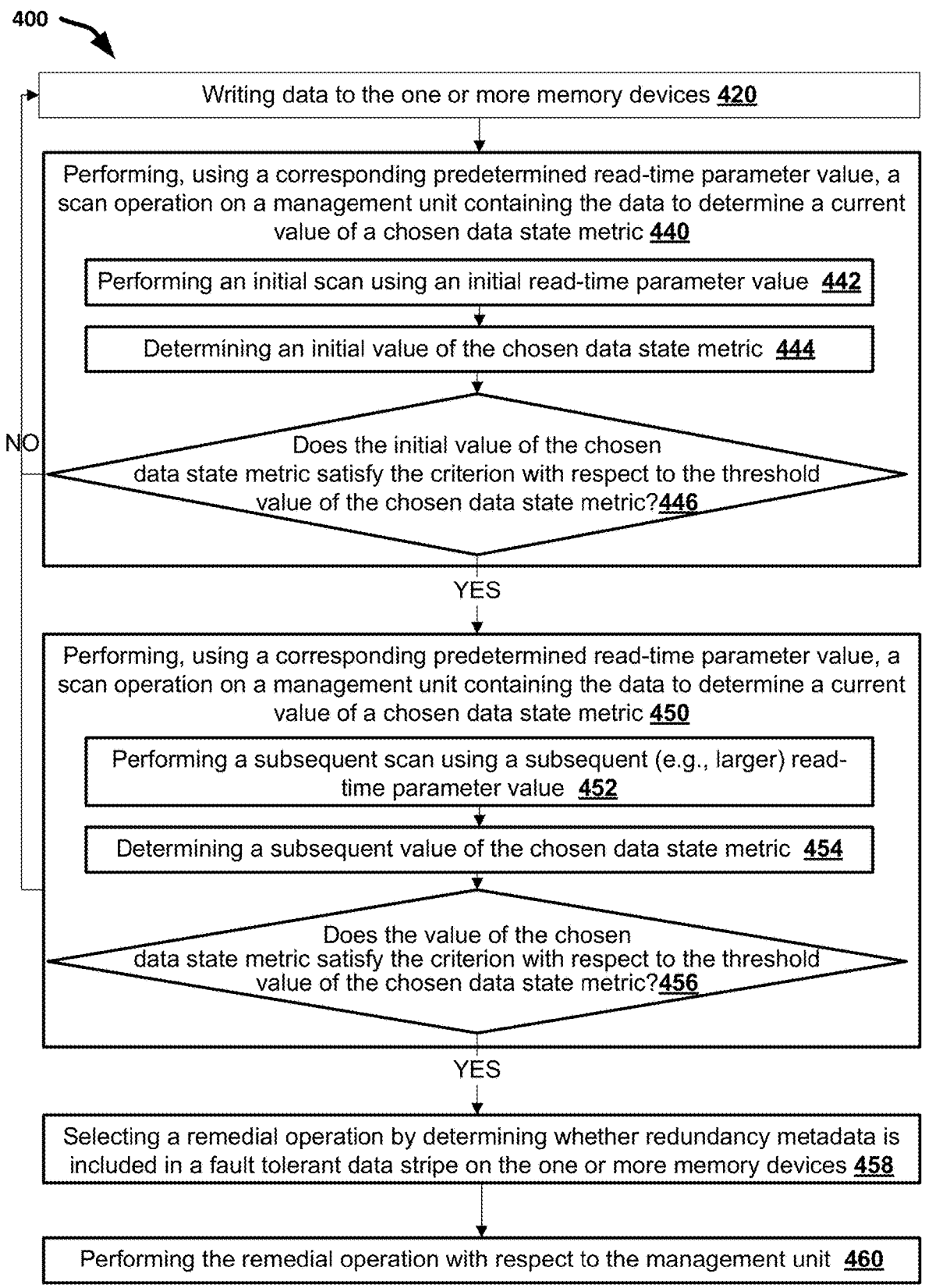
FIG. 4 is a flow diagram of an example method for performing multi-tiered defect scan management on memory devices in accordance with some embodiments of the present disclosure.

FIG. 4 is flow diagram of an example method 400 for performing multi-tiered defect scan management on memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 400 can be performed together with or instead of operations of example method 300. In some embodiments, at operation 420, the processing logic can write data to the one or more memory devices. If one or more RAIN schemes has been selected for use in a system, the processing logic can write the system data to a memory device in the system in accordance with the applicable RAIN scheme by storing the system data on the memory device along with RAIN metadata (i.e., redundant duplicated portions of the system data or redundancy metadata (e.g., parity metadata)). In some embodiments, the processing logic can store the RAIN metadata in the same location as the host data, while in other embodiments, the processing logic can store system data in one location (e.g., an area of the memory device) and store corresponding RAIN metadata in a different location (e.g., in local memory, on a different memory device, or in another area on the same memory device).

Thus, in some embodiments, at operation 440, the processing logic can perform, using a corresponding predetermined value of the read-time parameter, one or more scan operations on the MU containing the data to determine a current value of a chosen data state metric and check whether the current value satisfies a criterion. The data state metric can be a measure of the integrity of the data stored on a defined area on the memory device. For example, the data state metric can be an error count, a deviation of a threshold voltage reflective of a boundary between memory cell programming states, an error rate (e.g., an RBER), as well as other measures and indicators or combinations of measures and indicators. In some embodiments, the processing logic can perform each scan operation on the MU containing the written data and can determine an RBER resulting from the scan. For example, the scan can include the processing logic performing read operations on memory cells in a specified area (e.g., a set of memory cells or a group of pages) on the memory device or a portion (e.g., die, plane, block) of the memory device and calculating an RBER for the operations performed during the scan.

In some embodiments, the performance of each scan operation by the processing logic can be controlled using various parameters that characterize some of the operations of the scan. For example, the duration and accuracy of a scan can be controlled by changing a read-time parameter value such as the value of a read access time ("tR") parameter that determines the time within which a particular read operation should be completed. In some embodiments, the tR parameter value can depend on the amount of time allotted for the bitlines/wordlines to charge (i.e., ramp up voltage). Furthermore, a particular value of the tR parameter can itself be determined by the level of precision desired for applying particular voltage levels, along respective wordlines and bitlines, to memory cells during the performance of read operations. Accordingly, the use of different tR parameter values during respective scan operations can have different corresponding levels of accuracy of RBER measurement resulting from each of the scan operations.

In some embodiments operation 440 can include operations 442-446. For example, the processing logic can, at operation 442, perform an initial scan using an initial value of the read-time parameter, and can, at operation 444, determine an initial value of the chosen data state metric that results from the initial scan. Then, at operation 446, the processing logic can determine whether the initial value of the chosen data state metric satisfies a criterion with respect to the threshold value of the chosen data state metric. In some cases, the criterion can be defined to be satisfied when the initial value exceeds the threshold value. In other cases, the criterion can be defined to be satisfied when the initial value is less than the threshold value.

In some embodiments, the processing logic can perform an initial defectivity scan, at operation 442, using an initial tR value that is lower than a pre-set default tR value used for a default defectivity scan. Then, at operation 444, the processing logic can determine an initial RBER value resulting from the performed initial defectivity scan. Consequently, at operation 446, the processing logic can compare the RBER value obtained by the initial scan (i.e., the initial RBER value) with a threshold RBER value and determine that the measured RBER value satisfies the criterion because the measured RBER value exceeds the threshold RBER value. Conversely, at operation 446, the processing logic can determine that the RBER value is lower than the threshold RBER value and therefore does not satisfy the condition. In some cases, the processing logic can determine that, since the RBER value measured by the initial scan (i.e., a scan that uses a lower tR value than a default tR value) is lower than the threshold RBER value, a remedial operation does not need to be performed and can, proceed back to operation 420 (e.g., to write additional data to the memory device).

However, in some embodiments, the processing logic can determine that a value of the chosen data state metric (e.g., an RBER value) resulting from the initial scan exceeds a threshold value and, in response, perform a subsequent scan using a different value of the parameter. In some embodiments, at operation 450, the processing logic can perform, using a corresponding predetermined value of the read-time parameter, another scan on the data to determine the current value of a chosen data state metric. For example, the processing logic can determine at operation 446 that an RBER value resulting from the initial scan exceeds a threshold RBER value and, in response, perform, at operation 450 a subsequent scan.

In some embodiments operation 450 can include operations 452-456. For example, the processing logic can, at operation 452, perform a subsequent scan using a subsequent (e.g., larger, higher) value of the read-time parameter, and can, at operation 454, determine a subsequent value of the chosen data state metric that results from the subsequent scan. Then, at operation 456, the processing logic can determine whether the subsequent value of the chosen data state metric satisfies the criterion with respect to the threshold value of the chosen data state metric.

Accordingly, in some embodiments, the processing logic can perform, at operation 452 a subsequent scan using a relatively higher tR value than the tR value used for the initial scan. Then, at operation 454, the processing logic can, determine the subsequent RBER value resulting from the subsequent scan and determine, at operation 456, whether it satisfies a criterion with respect to a threshold RBER value. At operation 456, the processing logic can compare the RBER value obtained by the subsequent scan (i.e., the subsequent RBER value) with a threshold RBER value and determine that the measured RBER value satisfies the criterion because the measured RBER value exceeds the threshold RBER value. Conversely, at operation 456, the processing logic can determine that the RBER value is lower than the threshold RBER value and therefore does not satisfy the condition. In some cases, the criterion and the threshold value that the processing logic uses for this determination after the subsequent scan can be the same as those used the processing logic after the initial scan. In other cases, different criteria and threshold values can be used.

In some embodiments, the processing logic can, at operation 458, select a remedial operation (e.g., by determining whether redundancy metadata is present on the one or more memory devices). At operation 460, the processing logic can perform the remedial operation with respect to the area (e.g., MU) containing the scanned data. In some cases, the type of remedial operation that is selected at operation 458 to be performed at operation 460 can depend on whether or not redundancy metadata is included in a fault tolerant data stripe on the one or more memory devices. For example, the processing logic can perform a remedial operation on the MU (e.g., one or more blocks) that contains the data on the memory device. In some embodiments, the type of remedial operation that is selected for processing logic to perform can be contingent on whether or not RAIN metadata (e.g., redundancy metadata or redundant duplicate data portions) is included, and the type of RAIN metadata that is included, in a fault tolerant data stripe. Additional details regarding the selection and performance of the remedial operation are explained below with reference to FIG. 5.

Figure 5:
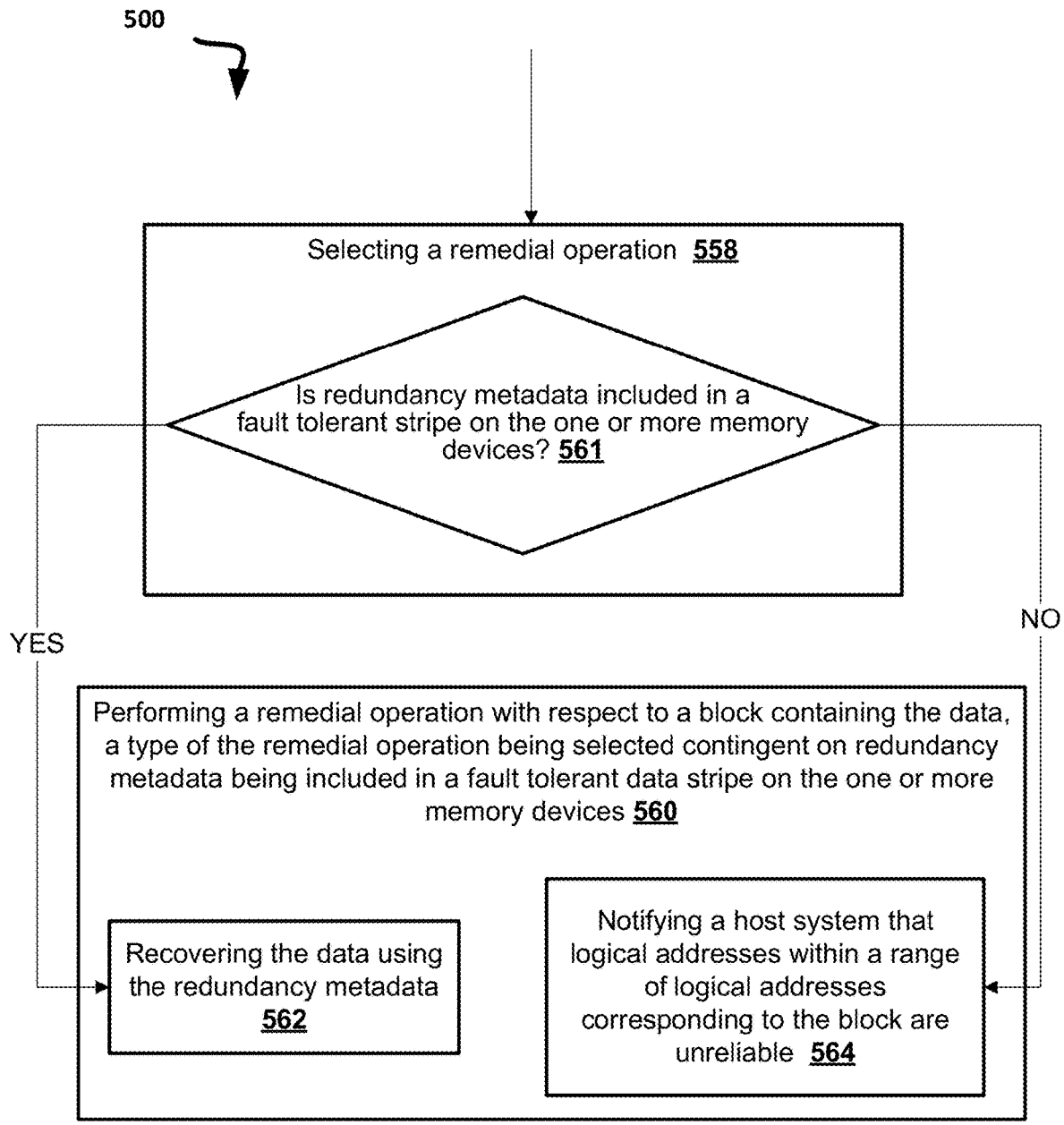
FIG. 5 is a flow diagram of an example method for performing remedial operations on memory devices in accordance with some embodiments of the present disclosure.

FIG. 5 is flow diagram of an example method 500 for performing remedial operations on memory devices in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 560, the processing logic can select a remedial operation to be performed.

Accordingly, in some embodiments, at operation 561, the processing logic can determine whether RAIN metadata (e.g., redundancy metadata or redundant duplicate data portions) is included in a fault tolerant data stripe on the one or more memory devices. In some embodiments, to select a remedial operation to perform, the processing logic can, at operation 561, determine whether redundancy metadata is included in a fault tolerant stripe on a single memory device or in a fault tolerant stripe having pages stored on multiple memory devices. Determining which remedial operation to perform can depend on whether the processing logic is implementing any RAIN scheme and, the type of RAIN scheme is being implemented.

Responsive to determining, at operation 561, whether redundancy metadata (e.g., parity metadata) is included in a fault tolerant stripe on one or more devices, the processing logic can at operation 560, perform a remedial operation with respect to the area (e.g., MU) containing the scanned data. In some embodiments, the type of the remedial operation selected for the processing logic to perform can be contingent on RAIN metadata being included in a fault tolerant data stripe on the one or more memory devices. Portions of the same fault tolerant data stripe (e.g., portions containing RAIN metadata) can be stored in different locations on the same device or on different memory devices.

In one example using a parity-based RAIN scheme, the processing logic can determine, at operation 561, whether redundancy metadata (e.g., parity metadata) is included in a fault tolerant stripe on one or more devices. Responsive to determining, at operation 561, that redundancy metadata (e.g., parity metadata) is included in a fault tolerant stripe on one or more devices, the processing logic can, at operation 562, use the redundancy metadata from the fault tolerant stripe to recover the portion of the data that was stored in the affected page and can rewrite the data in another location (e.g., on the same or different device).

In another example, using a parity-less RAIN scheme, the processing logic can perform a different remedial operation. For example, responsive to determining, at operation 561, that redundancy metadata (e.g., parity metadata) is not included in a fault tolerant stripe on one or more devices, the processing logic can determine whether duplicate portions of system data are included in a fault tolerant stripe on one or more devices. If they are, the processing logic, at operation 564 can notify a host system that logical addresses within a specified range of logical addresses correspond to an unreliable MU (e.g., the block) that was affected by the defect on the memory device. Thus, the processing logic can notify the host system that fault tolerance requirements of the host systems are violated.

In some embodiments, the host system can send a command to remedy the violation of the fault tolerance requirements. The command can be received by the processing logic. In response, the processing logic can, at operation 564, recover the portion of the system data stored on the affected area by using the other duplicate portions of the data in the fault tolerant stripe and rewrite the portion of the data or the entire stripe in another location (e.g., a different location on the same device, or on one or more different memory devices).

Figure 6:
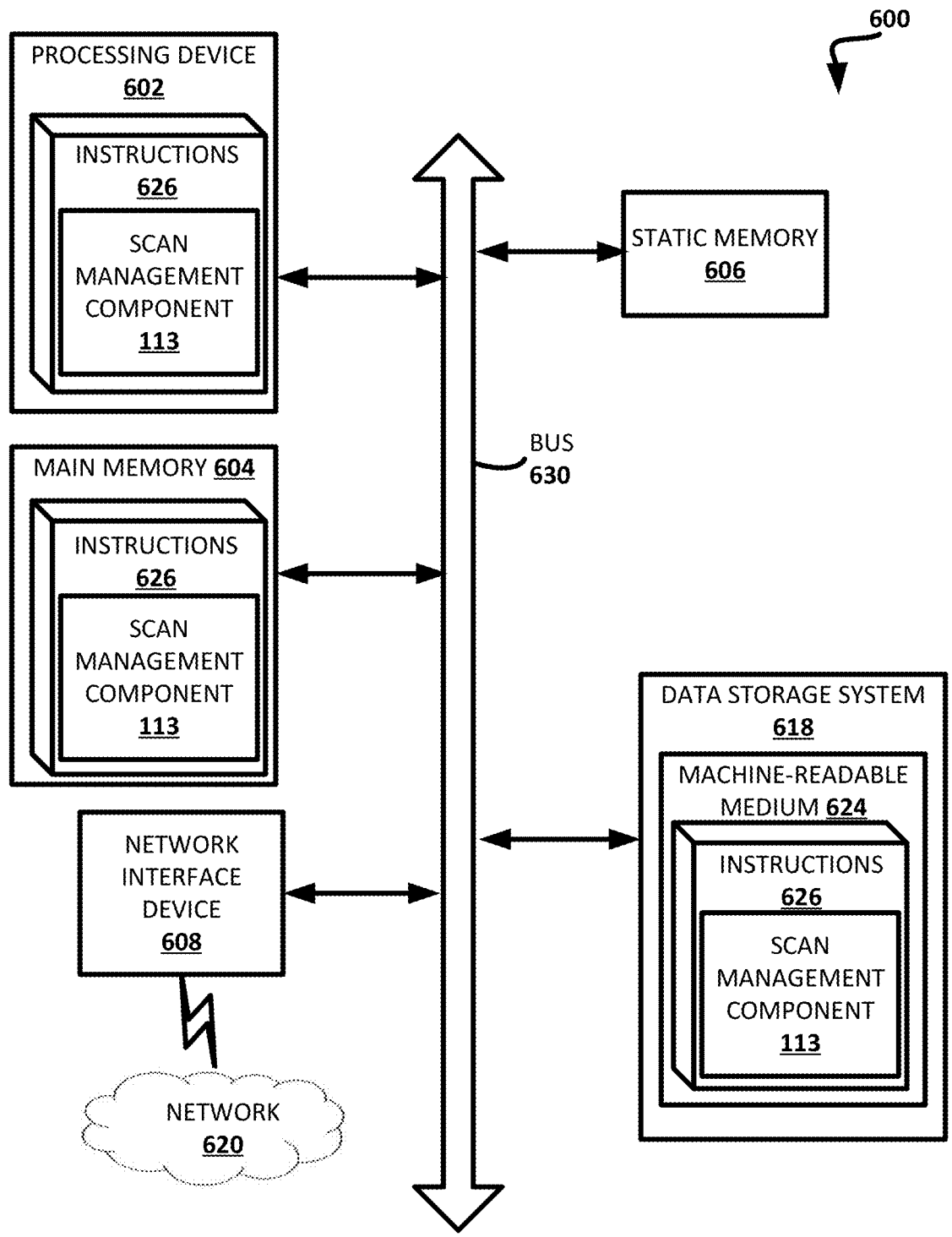
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a SMC (e.g., the scan management component 113 of FIG. 1 and the methods 300, 400, and 500 of FIGS. 3, 4, and 5 respectively). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system comprising:
one or more memory devices; and a processing device, operatively coupled with the one or more memory devices, to perform operations comprising:

writing data to the one or more memory devices;

performing one or more scan operations on a management unit containing the data to determine a current value of a chosen data state metric, wherein each scan operation of the one or more scan operations is performed using a corresponding predetermined read-time parameter value that indicates at least one of a duration of the scan operation or an accuracy of the scan operation;

determining whether the current value of the chosen data state metric satisfies a criterion;

responsive to determining that the current value of the chosen data state metric satisfies the criterion, selecting a remedial operation by determining whether redundancy metadata is included in a fault tolerant data stripe on the one or more memory devices; and performing the remedial operation with respect to the management unit.

2. The system of claim 1, wherein the corresponding predetermined read-time parameter value used for at least one scan of the one or more scan operations is smaller than a default read-time parameter value, and wherein performing the one or more scan operations comprises:

performing an initial scan using an initial read-time parameter value that is smaller than a default read-time parameter value;

determining an initial value of the chosen data state metric; and determining whether the initial value of the chosen data state metric satisfies the criterion with respect to a threshold value.

3. The system of claim 2, wherein performing the one or more scan operations further comprises:

responsive to determining that the initial value of the chosen data state metric satisfies the criterion, performing a subsequent scan using a subsequent read-time parameter value that is greater than the initial read-time parameter value; and determining a subsequent value of the chosen data state metric.

4. The system of claim 1, wherein writing the data comprises:

storing the data in the fault tolerant data stripe comprising a redundant array of independent NAND (RAIN) memory pages;

generating redundancy metadata for the fault tolerant data stripe; and storing the redundancy metadata on one of the memory devices; and wherein the remedial operation comprises recovering the data using the redundancy metadata.

5. The system of claim 1, wherein the remedial operation comprises notifying a host system that certain logical addresses correspond to an unreliable management unit.

6. The system of claim 1, wherein determining whether the current value of the chosen data state metric satisfies the criterion comprises determining whether the current value of the chosen data state metric exceeds a threshold value.

7. The system of claim 6, wherein the threshold value is defined by a maximum value of the chosen data state metric for which an error correction code operation is capable of correcting errors occurring when the data is read.

8. The system of claim 1, wherein the corresponding predetermined read-time parameter value is defined by a duration of a voltage ramping period of a read access operation performed during the one or more scan operations.

9. A method comprising:

writing data to one or more memory devices;

performing one or more scan operations on a management unit containing the data to determine a current value of a chosen data state metric, wherein each scan operation of the one or more scan operations is performed using a corresponding predetermined read-time parameter value that indicates at least one of a duration of the scan operation or an accuracy of the scan operation;

determining whether the current value of the chosen data state metric satisfies a criterion;

responsive to determining that the current value of the chosen data state metric satisfies the criterion, selecting a remedial operation by determining whether redundancy metadata is included in a fault tolerant data stripe on the one or more memory devices; and performing the remedial operation with respect to the management unit.

10. The method of claim 9, wherein the corresponding predetermined read-time parameter value used for at least one of the one or more scan operations is smaller than a default read-time parameter value and wherein performing the one or more scan operations comprises:

performing an initial scan using an initial read-time parameter value that is smaller than a default read-time parameter value;

determining an initial value of the chosen data state metric; and determining whether the initial value of the chosen data state metric satisfies the criterion with respect to a threshold value.

11. The method of claim 10, wherein performing the one or more scan operations further comprises:

responsive to determining that the initial value of the chosen data state metric satisfies the criterion, performing a subsequent scan using a subsequent read-time parameter value that is greater than the initial read-time parameter value; and determining a subsequent value of the chosen data state metric.

12. The method of claim 9, wherein writing the data comprises:

storing the data in the fault tolerant data stripe comprising a redundant array of independent NAND (RAIN) memory pages;

generating redundancy metadata for the fault tolerant data stripe; and storing the redundancy metadata on one of the memory devices; and wherein the remedial operation comprises recovering the data using the redundancy metadata.

13. The method of claim 9, wherein the remedial operation comprises notifying a host system that certain logical addresses correspond to an unreliable management unit.

14. The method of claim 9, wherein determining whether the current value of the chosen data state metric satisfies the criterion comprises determining whether the current value of the chosen data state metric exceeds a threshold value.

15. A non-transitory computer-readable storage medium comprising instructions that, when executed by a processing device, cause the processing device to perform operations comprising:

writing data to a non-volatile memory device;

performing one or more scan operations on a management unit containing the data to determine a current value of a chosen data state metric, wherein each scan operation of the one or more scan operations is performed using a corresponding predetermined read-time parameter value that indicates at least one of a duration of the scan operation or an accuracy of the scan operation;

determining whether the current value of the chosen data state metric exceeds a threshold value;

responsive to determining that the current value of the chosen data state metric exceeds the threshold value, selecting a remedial operation by determining whether redundancy metadata is included in a fault tolerant data stripe on the non-volatile memory device; and performing a remedial operation with respect to the management unit.

16. The non-transitory computer-readable storage medium of claim 15, wherein the corresponding predetermined read-time parameter value used for at least one of the one or more scan operations is smaller than a default read-time parameter value and wherein performing the one or more scan operations comprises:

performing an initial scan using an initial read-time parameter value that is smaller than a default read-time parameter value;

determining an initial value of the chosen data state metric; and determining whether the initial value of the chosen data state metric exceeds the threshold value of the chosen data state metric.

17. The non-transitory computer-readable storage medium of claim 16, wherein performing the one or more scan operations further comprises:

responsive to determining that the initial value of the chosen data state metric exceeds the threshold value, performing a subsequent scan using a subsequent read-time parameter value that is greater than the initial read-time parameter value; and determining a subsequent value of the chosen data state metric.

18. The non-transitory computer-readable storage medium of claim 15, wherein writing the data comprises:

storing the data in the fault tolerant data stripe comprising a redundant array of independent NAND (RAIN) memory pages;

generating redundancy metadata for the fault tolerant data stripe; and storing the redundancy metadata on the non-volatile memory device; and wherein the remedial operation comprises recovering the data using the redundancy metadata.

19. The non-transitory computer-readable storage medium of claim 15, wherein the remedial operation comprises notifying a host system that that certain logical addresses correspond to an unreliable management unit.

20. The non-transitory computer-readable storage medium of claim 15, wherein the chosen data state metric is a raw bit error rate (RBER) and wherein determining whether the current value of the chosen data state metric exceeds a threshold value comprises determining whether a resulting RBER value exceeds a threshold RBER value.

* * * * *